Figure 3:
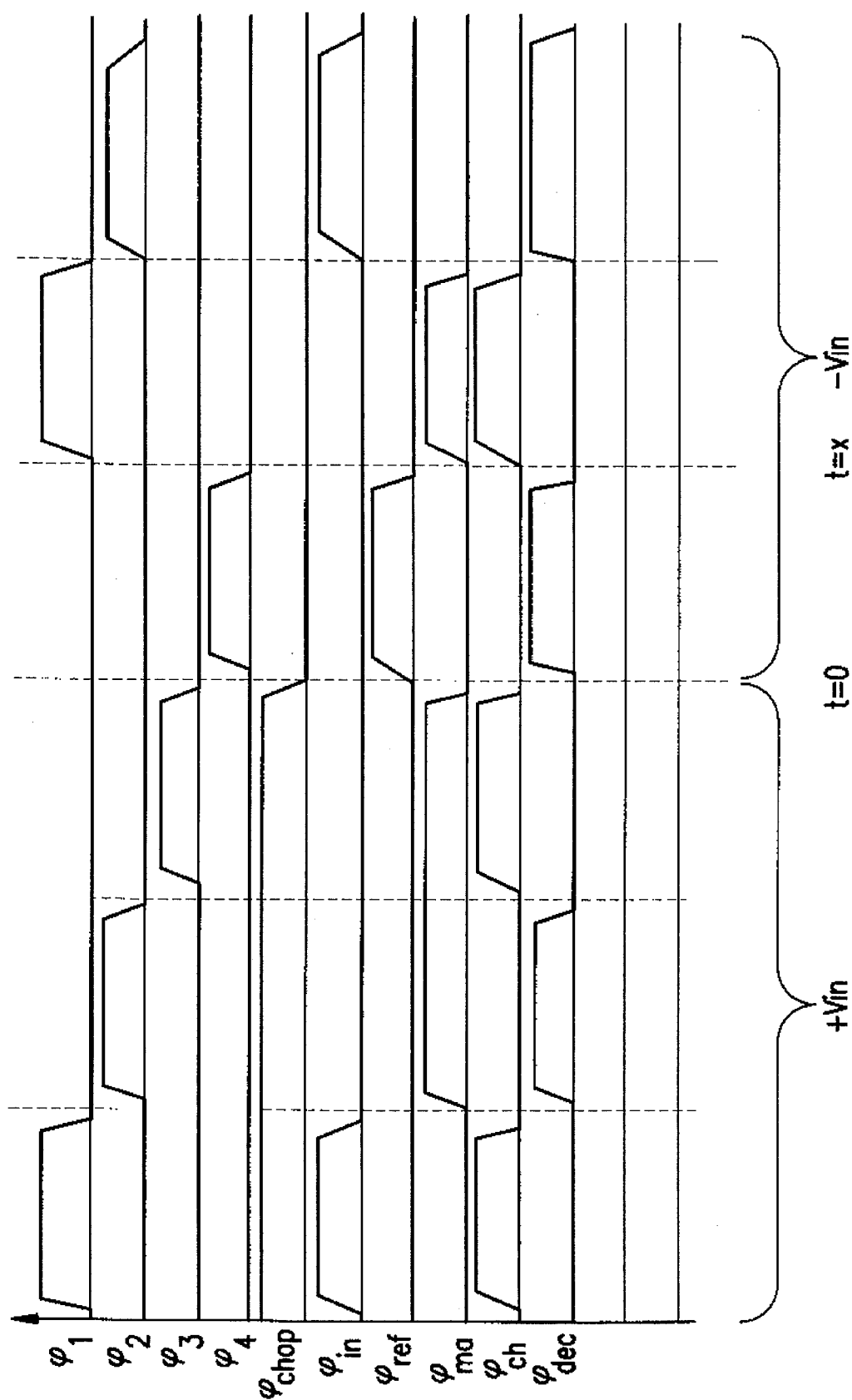

United States Patent [19]
Gervais et al.

[11] Patent Number: 5,585,716
[45] Date of Patent: Dec. 17, 1996

[54] MULTIPLE STAGE FREQUENCY MODULATED CIRCUIT

[75] Inventors: Michel Gervais, Champigny sur Marne; Denise Schang, Montrouge; Alain Bazin, Villejuif, all of France

[73] Assignee: Schlumberger Industries, S.A., Montrouge, France

[21] Appl. No.: 182,950

[22] Filed: Jan. 13, 1994

[30] Foreign Application Priority Data

Jan. 20, 1993 [EP] European Pat. Off. ............... 93400131
Mar. 4, 1993 [EP] European Pat. Off. ............... 93400560

[51] Int. Cl.$^6$ .......................... G01R 21/06; H03M 3/00
[52] U.S. Cl. ............................................. 324/142; 341/143
[58] Field of Search ................................... 324/142, 141, 324/107; 364/483; 341/143; 375/27

[56] References Cited

U.S. PATENT DOCUMENTS

| | | | |
|---|---|---|---|
| 4,663,590 | 5/1987 | Gershenson et al. | 324/248 |
| 4,706,066 | 11/1987 | Dijkmans | 341/143 |
| 4,761,605 | 8/1988 | Jochum | 324/142 |
| 5,027,120 | 6/1991 | Thurston | 341/143 |
| 5,099,195 | 3/1992 | Greer et al. | 324/142 |
| 5,301,121 | 4/1994 | Garverick et al. | 364/483 |

FOREIGN PATENT DOCUMENTS

| | | |
|---|---|---|
| 0375173 | 6/1990 | European Pat. Off. . |
| 2570854 | 3/1986 | France . |
| 2118726 | 11/1983 | United Kingdom . |

*Primary Examiner*—Ernest F. Karlsen
*Attorney, Agent, or Firm*—K. G. W. Smith

[57] ABSTRACT

A signal processing circuit, including at least two stages of frequency modulation (25,20; 28, 31, 33) and demodulation of signals applied to or generated within that circuit, characterized in that the modulating and demodulating signal for each stage is an effective square wave and in that the ratio of the frequencies (F1, F2) of the modulating signals for the first and second stages corresponds substantially to the ratio of an even integer to an odd integer, or vice versa, such that there are substantially no common frequencies or harmonics between the first and second modulating signals.

12 Claims, 3 Drawing Sheets

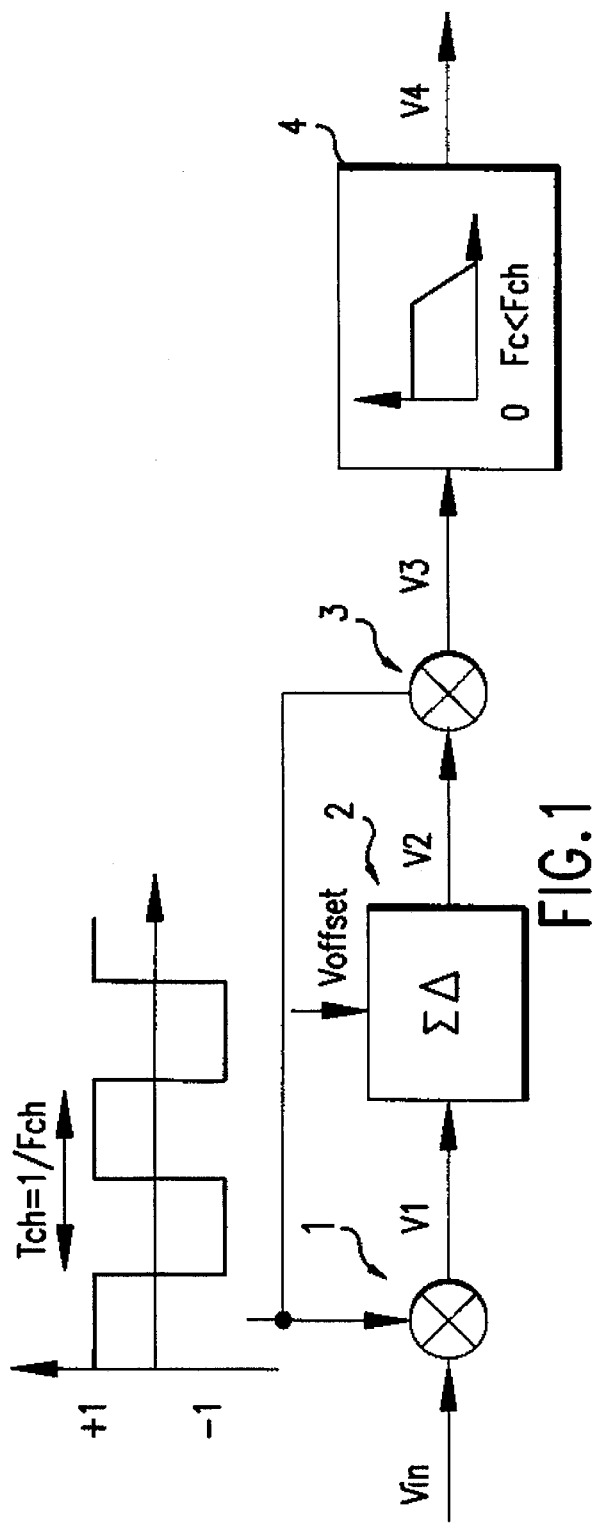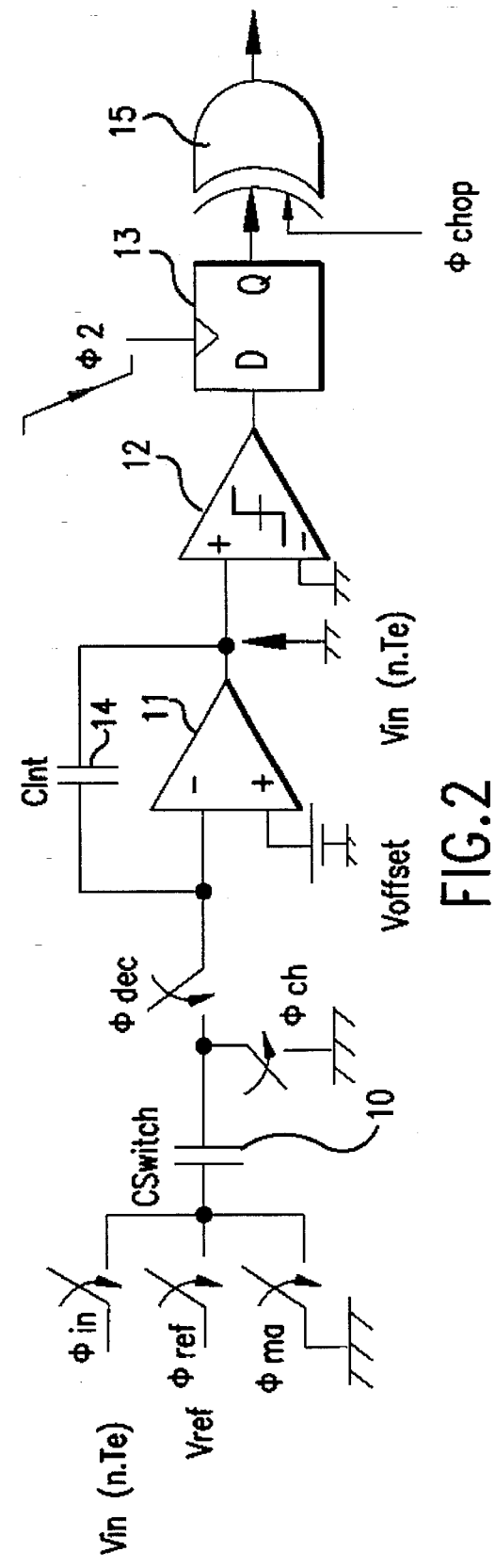

MULTIPLE STAGE FREQUENCY MODULATED CIRCUIT

The present invention relates to a signal processing circuit, including at least two stages of frequency modulation and demodulation of signals applied to or generated within that circuit.

Frequency modulation is a well-known method of dealing with constant noise sources in a circuit. For example, integrator circuits can suffer from problems associated with voltage offsets across the input of the amplifier. Frequency modulation or "chopping" of the input signal is one method of removing the effect of these offset voltages. Typically, the polarity of an input signal to the amplifier is modulated by is an applied frequency or "chopper" modulating signal, such that the input signal is applied alternately with a positive and negative polarity. The modulated input signal, and any offset voltage, is integrated and the output signal is then demodulated, for example, by an exclusive OR gate or an inverter clocked by the modulating frequency signal. This demodulated signal comprises a constant signal corresponding to the integrated input signal superimposed with an offset noise signal having the frequency of the chopper signal. The offset signal can then be removed by filtering the composite signal through a filter having a high frequency cut-off below the chopper frequency.

Such modulating techniques are used in particular in sigma-delta analog to digital converters, in which a reference voltage of varying sign is summed with an input voltage and integrated, the output of the integrator being sent to a comparator and the output of the comparator fed back to control the polarity of the reference voltage, the polarity of the reference voltage being chosen to tend to bring the output of the integrator towards zero. Such converters are well-known in the art and are described, for example, in U.S. Pat. No. 3,659,288, and U.S. Pat. No. 4,009,475, as well as in many others. Combined sigma-delta circuits are also known (see FR 2 570 854), in which a first signal is sent to a first sigma-delta, the pulsed output of this converter controlling, the polarity of a second signal to a second sigma-delta converter. The output of the second sigma-delta represents the product of the two signals. Such circuits find particular application in metering circuits where signals representing the voltage and current are fed to each converter, the output signal representing the energy consumed.

The operation of sigma-delta converters and combined sigma-delta circuits is conventional and need not be discussed in any further detail. Frequency modulation, in which the polarity of the input voltage is additionally varied, is also known in relation to these circuits and is also discussed in French Patent No. 2,570,854, in which an input voltage is sampled by means of an arrangement of switching capacitors, the polarity of the input voltage being modulated according to the sequence of capacitor switching used and demodulated by an exclusive OR gate.

Problems can arise where two or more stages of frequency modulation are applied. For example, in a combined sigma-delta circuit, a first frequency modulation and demodulation may be applied to the first input signal and the output of the first sigma-delta converter and a second modulation and demodulation to the second input signal and the output of the second converter, to compensate for offset noise in each converter. Each frequency modulation has the effect of introducing a further noise signal having a main frequency and harmonically related frequencies corresponding to the frequency of that modulation. To some extent, such frequency related noise is unavoidable. However, where two stages of frequency modulation are used there is risk that the noise signals will reinforce each other. Even if the frequencies of modulation are chosen to be different to each other there is still a danger that reinforcement will occur at a frequency corresponding to a multiple of these frequencies or to a multiple of one or more of the harmonics of these frequencies. Such reinforced noise signals can be of relatively great amplitude and can also be difficult to filter out, depending on their frequency as related to the frequencies of interest to that circuit.

Further problems of reinforcement of noise signals can arise when one or more of the input signals to the circuit has a characteristic frequency, as any noise at this frequency or its harmonics may also be reinforced by the frequency modulation of the first and/or second stages. This problem may arise, for example, when the circuit is being used in the measurement of current and/or voltage of an alternating supply voltage.

The present invention is characterized in that the modulating and demodulating signal for each stage is an effective square wave and in that the ratio of the frequencies of the modulating signals for the first and second stages corresponds substantially to the ratio of an even integer to an odd integer, or vice versa, such that there are substantially no common frequencies or harmonics between the first and second modulating signals.

Square waves have the unusual harmonic characteristic that they develop only odd harmonics, that is, for a square wave of frequency F, the only harmonics generated will be at the frequencies 3F, 5F, 7F, 9F etc. No even harmonics are generated and any associated noise will be centered around the main frequency and these odd harmonic frequencies.

Selection of the first and second frequencies such that their ratio corresponds to the ratio of an even to an odd integer (or vice versa) thus ensures that there will be no common reinforcing frequencies between the two.

For example, consider a first modulating frequency of 25 Hz. This will have associated harmonics at 75 Hz, 125 Hz, 175 Hz etc. Selecting a second harmonic frequency of half the frequency of the first, i.e. such that their ratio is at 2F:1F, gives rise to noise at the frequencies 12.5 HZ, 37.5 Hz, 62.5 Hz, 112.5 Hz etc. Thus, there will be no common reinforcing frequencies between the modulating signals. Other ratios of the same odd to even relationship (or vice versa) will give the same results; 1F:2F, 4F:1F, 6F:1F, 8F:1F, 4F:3F, 6F:5F, 3F:4F etc. In such case, the odd harmonics of one signal will be at odd multiples of F while the odd harmonics of the other signal will be at even multiples of F, thereby ensuring no common frequencies between the two.

Preferably, the ratio between the frequencies of the modulating signals substantially corresponds to the ratio of an even integer to unity, i.e. 2:1, 4:1, 6:1, 8:1 etc. In particular, the ratio between the frequencies of the modulating signals may be advantageously set at two to one. Such ratios, in particular the ratio 2:1, ensure the best separation between the frequencies of the harmonics of each signal. More complex ratios may run the risk that, at certain harmonics towards the high frequencies, the frequency difference between the first and second signals will not be very great, such that some reinforcement may occur. On the other hand, the noise associated with each signal generally centers around the main frequency and decreases quickly towards the higher harmonics, such that the effects of any reinforcement between two high frequency harmonics separated by a small frequency gap may be negligible for such more complex ratios.

The present invention is particularly applicable to a signal processing circuit comprising one or more sigma-delta converters, for example, a combination used to multiply two input signals together in which the first stage of frequency modulation and demodulation is applied to the first sigma-delta converter and in which the second stage of frequency modulation is applied to the second sigma-delta converter. In such sigma-delta multipliers, the output of the first sigma-delta converter acts to control the polarity of the second input signal to the second sigma-delta converter, e.g. to pass this signal via an inveter or not. The second modulation can be applied to the second input signal before this processing or after, demodulation being effected after the signal has passed through the second sigma-delta converter. The invention is applicable to other combination sigma-delta circuits, such as, for example a series of sigma-delta converters used to reiteratively process a single signal.

The present invention is further particularly applicable to a processing circuit including one or more sigma-delta converters, in which the modulation of input signals is applied at the input of the or each sigma-delta converter by means of a switched capacitor arrangement. Such switched capacitor arrangements are known in relation to sigma-delta converters, for example, in French Patent No. 2,570,854 and typically comprise a central capacitor, which functions to transfer a charge corresponding to the magnitude of an input voltage to the amplifier of the sigma-delta converter, together with associated switches. The polarity of the input signal is varied by controlling the timing of the associated switches, which timing may be controlled logically dependent on the output of the sigma-delta, the output of a first sigma-delta, if appropriate, and the state of the modulating signal. Demodulation of the signal at the output of the converter may be effected by an exclusive OR gate.

The present invention extends to a meter for monitoring the consumption of electricity from a power source including a signal processing circuit as described above. In particular, such a meter may use a combination of sigma-delta devices, the input of the first and second sigma-delta devices being adapted to measure the current and voltage of the supply, for example, by means of a shunt or voltage divider etc. For an electricity meter adapted for measuring an a.c. supply, the meter may further include means for measuring the actual frequency of the a.c. supply and means for synchronising the frequency of the first and/or second modulation signals with the measured a.c. frequency.

Further problems of interference between one or both of the modulating signals and noise associated with the a.c. supply frequency may also arise in such contexts as discussed above.

Viewed from a second aspect, the invention also extends to a meter including one or more stages of modulation using square wave modulating signals, in which the ratio between the frequency of one modulation signal and the measured a.c. supply frequency corresponds substantially to the ratio of an odd to an even integer, respectively, such that there are substantially no common frequencies or harmonics between that signal and the a.c. power supply.

The usual a.c. supply signal is a sine wave. Unlike a square wave, such a supply will have harmonics at all integer multiples of the supply frequency; 1F, 2F, 3F, 4F etc. Therefore, in order to ensure the absence of any common reinforcing frequencies between a modulating frequency and the supply it is necessary that the ratio of frequencies between that modulating frequency and the a.c. supply corresponds to that of an odd integer to an even integer. It is not possible, for example, to eliminate common frequencies using the inverse of this ratio i.e. a ratio of modulating frequency/a.c. supply of an even integer to odd integer.

For example, consider an a.c. supply of 50 Hz frequency. Harmonics will occur at 100 Hz, 150 Hz, 200 Hz, 250 Hz etc., each with gradually decreasing intensity. A modulating frequency of a square wave at 25 Hz (i.e. in the ratio 1:2) will produce harmonics at 75 Hz, 125 Hz, 175 Hz, 225 Hz etc., i.e. never at a common frequency with the a.c. supply. Other ratios will give the same result, 1F:4F, 1F:6F, 3F:4F etc., but not ratios of 2F:1F, 4F:3F etc.

In one preferred embodiment, the ratio between the frequency of one modulation and the measured a.c. supply frequency is set at the ratio of unity to an even integer. In particular, the ratio may be set at 1:2. Again, this gives a good separation between the harmonics of the two signals.

In a particularly preferred embodiment using two stages of modulation, the ratio of the frequency of the modulating signals to each other and to the a.c. frequency may be set such that there are no common frequencies between any of the signals. For example, the ratio of the first modulating frequency to the a.c. may be set at 1:2 and the ratio of the second modulating frequency to the first at 1:2. Thus, for an a.c. frequency of 50 Hz, harmonics will arise at 100 Hz, 150 Hz, 200 Hz, 250 Hz etc. The first modulating frequency will be at 25 Hz with harmonics at 75 Hz, 125 Hz, 175 Hz, 225 Hz etc, while the second modulating frequency will be at 12.5 Hz with harmonics at 37.5 Hz, 62.5 Hz, 87.5 Hz, 112.5 Hz.

Alternatively, it may be that the reinforcement between only one of the modulating frequencies with the a.c. frequency is important, such that the other modulating frequency may be set at a ratio at which some reinforcement with the a.c. signal may occur.

The invention may further extend to methods of signal processing or metering involving one or more steps of modulation and demodulation; such methods may be further characterized by any or all of the preferred features discussed above.

Figure 4:
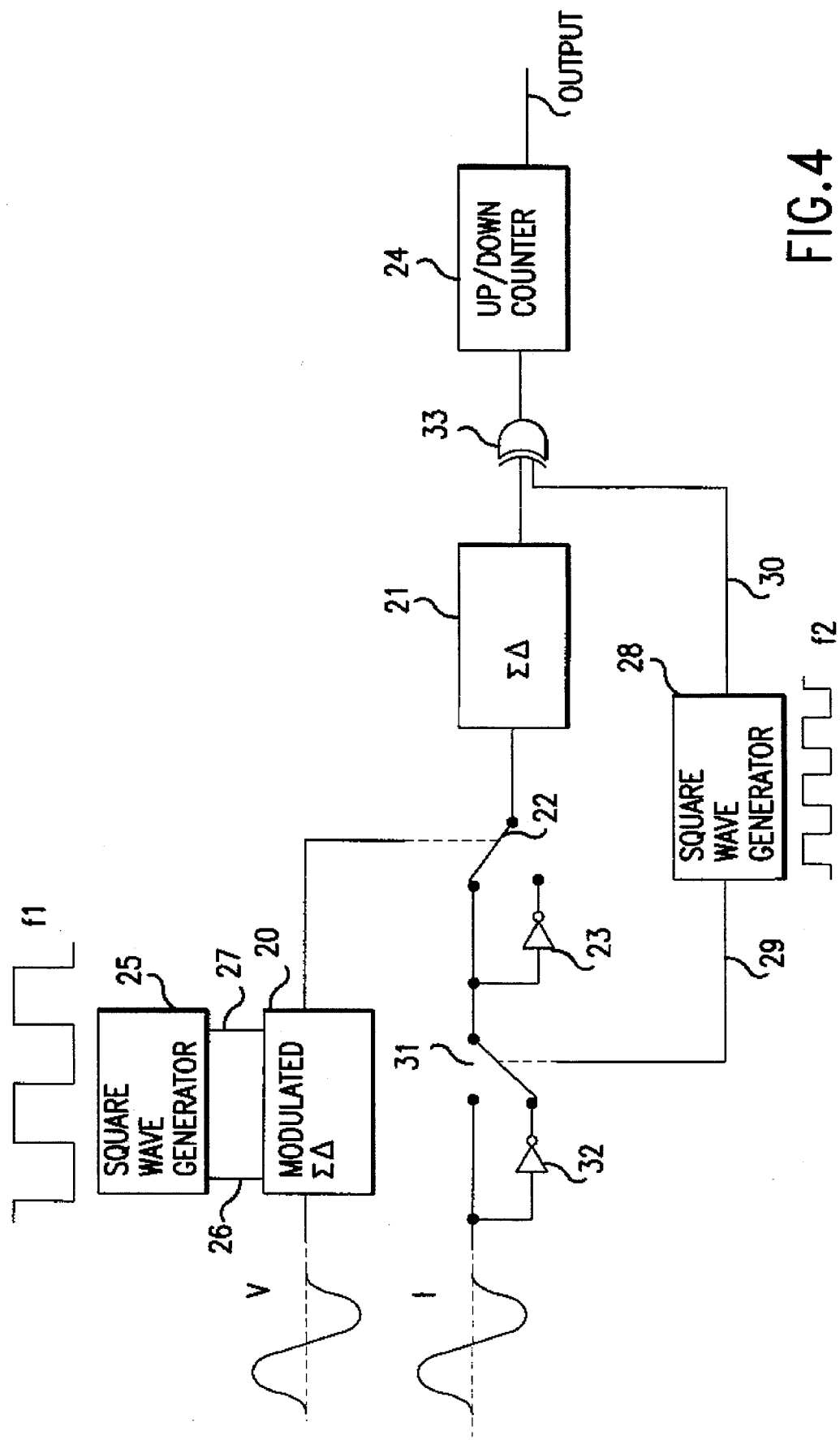

There will now be described, by way of example, a preferred embodiment of the present invention, with reference to the accompanying drawings, in which:

FIG. 1 shows a generalized circuit using frequency modulation of an input signal to overcome offset, FIG. 2 shows a conventional sigma-delta converter adapted to enable frequency modulation of input signals and demodulation of output signals, FIG. 3 shows a timing diagram of the switching arrangement associated with the sigma-delta converter of FIG. 2, and FIG. 4 shows a combined sigma-delta circuit according to an embodiment of the invention using two sigma-delta circuits in combination with two stages of modulation.

Referring to FIG. 1, there is shown a generalized view of a circuit, such as a sigma-delta circuit, including frequency modulation. A square wave chopper signal Tch is added to the input signal V1 at point 1 and the combined signal is passed through the sigma-delta converter 2, which includes an associated constant offset voltage Voffset. The output signal is demodulated at 3 by subtraction of the same chopper. The demodulated signal at this point will comprise the converted input signal having a constant value and a superimposed offset noise signal having the frequency of the chopper signal. This signal is then passed through a filter 4 having a frequency cut-off at a point below the frequency of the chopper signal, thereby filtering out the offset noise and providing a signal corresponding to the converted input signal without the effects of the offset.

Referring to FIG. 2, there is shown a conventional sigma-delta conversion circuit including switching capacitor means for controlling the polarity of the input reference voltage and also to effect frequency modulation by controlling the polarity of the input signal voltage. Specifically, input signal Vin and reference signal Vref are fed via an arrangement of switches φin, φref, φma, φch, φdec and a switching capacitor 10 to an operational amplifier 11 and integrating capacitor 14. The polarity of a signal sent to the amplifier is dependent on the order in which the switches are operated. For example, in order to transmit Vref with the same polarity to the input of the amplifier 11, φref and φch are first closed to place a charge corresponding to Vref on the switching capacitor 10. Then φref and φch are opened and φdec and φma closed such that φma is connected to earth and the charge appears at the input of the amplifier 11 with the same polarity as the input voltage. To transmit Vref with an opposite polarity, φref and φdec are closed simultaneously, such that a charge of the opposite potential appears at the other side of the capacitor and to the input of the amplifier.

This reversal of signals through use of a switching capacitor and associated switches is known in the art and the operation of the sigma-delta circuit shown in FIG. 2 to control the polarity of the reference voltage Vref using the switching arrangement and depending on the clocked output Q of the comparator 12 and bistable 13 is known. Modulation of the input signal Vin is controlled in this circuit by varying the polarity of the input signal through the timing of the switches in a similar manner. Demodulation of the output signal Q is achieved by means of an EOR gate 15.

Referring to the timing diagram shown in FIG. 3, a regular series of phase pulses φ1, 2, 3, 4 are generated e.g. by a microprocessor (not shown). The switches φin, φma, φref, φch, φdec are controlled by the microprocessor relative to these phases.

Expressed logically, the switches are controlled as follows:

φin =φ1.$\overline{\phi chop}$+φ2.$\overline{\phi chop}$
φma=[φ1.φchop+φ2.$\overline{\phi chop}$]+[φ3.Q+φ4.$\overline{Q}$]
φref=φ3. $\overline{Q}$+φ4.Q
φch=φ1+φ3
φdec=φ2+φ4

As will be apparent, φin, φma are controlled depending on the signal modulation, determined by φchop, φma and φref being further controlled depending on the output Q, as in the conventional operation of a sigma-delta circuit.

The modulating signal φchop has the form of a square wave as shown in FIG. 3 and is also applied to the exclusive OR gate 15 to demodulate the signal from the sigma-delta. The logic circuitry required to implement the control of the switches φin, φref etc. depending on the state of the chopping signal or the output Q is conventional and one skilled in the art would have no difficulty in constructing this. Demodulation of the output signal signal can occur immediately after the sigma-delta or further downstream, depending on the positioning of the exclusive OR gate. Similarly, modulation of the input signal can occur upstream from the sigma-delta circuit through the use an analog equivalent such as an inverter. Where modulation is performed upstream of the converter, φin and φma can be logically controlled independent of the chopping frequency to always transfer the input spinal with same polarity as it is received at the input of the sigma-delta.

FIG. 4 is a diagram of a circuit using two sigma-delta converters 20, 21 acting on the current I and voltage V of an a.c. signal to give an energy or power output to an up/down counter and including two stages of frequency modulation. The sigma-delta converter 20 corresponds essentially to that shown in FIG. 2, while converter 21 is modified in that modulation and demodulation occur outside the converter.

The output of the sigma-delta circuit 20 gates the input of the current signal to the sigma-delta circuit 21 by means of a switch 22 and inverter 23 arrangement, such that the polarity of the signal supplied to the sigma-delta 21 is dependent on the polarity of the output pulse from the sigma-delta circuit 20. As discussed earlier, this has the result that the pulses output from the sigma-delta 21 will reflect the product of the magnitude of the input signals to each sigma-delta and an up/down counter 24 counts the difference between the number of positive and negative pulses to give an output indicative of this product to a LED display or similar.

The circuit also includes two stages of modulation. The first stage is applied by a square wave generator 25 to the sigma-delta converter 20. The converter 20 has essentially the same construction as the converter shown in FIG. 2. The chopping signal output 26 of the generator controls the arrangement of switches φ at the input of the converter to modulate the input voltage signal in the manner discussed above. The other output 27 is sent to the exclusive OR gate 15 at the output of the converter to demodulate the resultant signal from the converter. The second stage is applied by the square wave generator 28. One output 29 is sent to a switch 31 and inverter 32 to modulate the input current signal, i.e. to invert or pass directly the current signal depending on the state of the square wave. This control of the polarity of the input signal is performed in addition to the modulation by the output of the first sigma-delta by the switch 22 and inverter 23 arrangement. The second output 30 of the generator 28 is sent to an exclusive OR gate 33 to subsequently demodulate the product signal from the second sigma-delta.

Filters (not shown) are also added to the circuit at the output of the first converter 20 and the exclusive OR gate 33 to filter out the frequency dependent noise signals.

The introduction of two modulating frequencies in addition to the frequency of the mains supply could give rise to problems of reinforcement between the harmonics and/or main frequencies of the signals, resulting in erroneous noise signals concentrated at such coincident frequencies. However, in the embodiment shown in FIG. 4, the frequency F1 of the first square wave generator 25 is set at twice the frequency F2 of the second square wave generator 28. As discussed earlier, modulation of signals by square waves introduces only odd harmonic signals into the circuit. Thus, for a first frequency of 25 Hz, harmonics of 75 Hz, 125 Hz, 175 Hz, 225 Hz etc. will be introduced, while for a second frequency of 12.5 Hz, harmonics of 37.5 Hz, 62.5 Hz, 87.5 Hz, 112.5 Hz will be introduced. That is, for a ratio of 2:1 for the frequencies of the first and second generators, no common harmonics will arise, such that any noise introduced into the circuit by these modulations will be minimised.

As discussed in the introduction, further frequency ratios which avoid reinforcement between the first and second square waves are also possible.

In a particularly preferable embodiment, the frequency of the square wave generators 25, 28 can be synchronised to the a.c. frequency for example, by using a peak or zero-crossing detector to measure the frequency of the voltage (or current) waveform and to adjust the frequency of the modulating square waves accordingly. With such synchronization, the frequency ratio between each of the modulating frequences and the a.c. supply can be set at a value to avoid reinforcement with the a.c. signal. For example, the ratio between the a.c. frequency and the first frequency F1 may be set at 2:1, such that, for an a.c. frequency of 50 Hz, F1 will be 25 Hz and F2 will be 12.5 Hz. The mains a.c. frequency, being essentially sinusoidal, will give rise to odd and even harmonics at 100 Hz, 150 Hz, 200 Hz, 250 Hz etc. However, none of these will coincide with the harmonics of the first and second square waves at 75 Hz, 125 Hz, 175 Hz, 225 Hz etc. and 37.5 Hz, 62.5 Hz, 87.5 Hz, 112.5 Hz etc., respectively.

If the mains a.c. frequency is known to be constant with time, the synchronization may be dispensed with by merely assuming this fixed frequency and setting F1 and F2 accordingly, rather than by synchronizing to a measured a.c. frequency.

We claim:

1. A signal processing circuit, including a first analog to digital converter and a second analog to digital converter, each analog to digital converter being subject to frequency modulation of signals upstream of the converter and demodulation of signals downstream of said converter, characterized in that the modulating and demodulating signal for each stage is an effective square wave and in that the ratio of the frequencies of the modulating signals for said first stage and said second stage corresponds substantially to the ratio of an even integer to an odd integer, or vice versa, such that there are substantially no common frequencies or harmonics between said first modulating signal and said second modulating signal.

2. The signal processing circuit of claim 1, wherein the ratio of the frequencies of said first modulating signal and said second modulating signal substantially corresponds to the ratio of an even integer to unity, or vice versa.

3. The signal processing circuit of claim 1, wherein the ratio of the frequencies of said first modulating signal and said second modulating signal is substantially 2:1, or vice versa.

4. The signal processing circuit of claim 3 in which at least one of said analog to digital converters is a sigma-delta converter.

5. The signal processing circuit of claim 4 in which both of said analog to digital sigma-delta converters are arranged so as to multiply two input signals together.

6. The signal processing circuit of claim 4 in which modulation of input signals is applied at the input of one or more sigma-delta converters by means of a switched capacitor arrangement.

7. The signal processing circuit of claim 4 in which demodulation is effected at the output of one or more sigma-delta converters by an exclusive OR gate.

8. The signal processing circuit of claim 1, adapted to receive an input signal representative of a characteristic of an a.c. supply, in which the ratio of the frequency of one modulation signal to the a.c. supply frequency corresponds substantially to the ratio of an odd to an even integer, respectively such that there are substantially no common frequencies or harmonics between that signal and the a.c. power supply.

9. The signal processing circuit of claim 8 in which the ratio between the frequency of one/modulation signal and the measured a.c. supply frequency is set at the ratio of unity to an even integer.

10. The signal processing circuit of claim 9 in which the ratio of the first modulating frequency to the a.c. supply is set at 1:2 and the ratio of the second modulating frequency to the first modulating frequency at 1:2.

11. The signal processing circuit of claim 8 including a combination of two sigma-delta converters to multiply two inputs together, the inputs of said first converter and said second sigma-delta converter being adapted to receive a signal representative of the current and voltage of a power supply, respectively, and in which the first stage of frequency modulation is applied to said first sigma-delta converter and the second stage is applied to said second sigma-delta converter.

12. The signal processing circuit of claim 8 further comprising means for measuring the frequency of the a.c. supply and means for synchronizing the frequency of at least one of said first modulating signal and said second modulating signal with the measured a.c. supply.

* * * * *